(12) United States Patent
Hwang et al.

(10) Patent No.: US 12,051,374 B2
(45) Date of Patent: Jul. 30, 2024

(54) DISPLAY PANEL AND DISPLAY DEVICE USING THE SAME

(71) Applicant: LG DISPLAY CO., LTD., Seoul (KR)

(72) Inventors: Seong Hwan Hwang, Paju-si (KR); Byeong Uk Gang, Paju-si (KR); Mun Chae Yoon, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 17/523,518

(22) Filed: Nov. 10, 2021

(65) Prior Publication Data

US 2022/0148516 A1    May 12, 2022

(30) Foreign Application Priority Data

Nov. 12, 2020  (KR) .................. 10-2020-0150906

(51) Int. Cl.
*G09G 3/3275*   (2016.01)
*G09G 3/3258*   (2016.01)
(Continued)

(52) U.S. Cl.
CPC ......... *G09G 3/3275* (2013.01); *G09G 3/3258* (2013.01); *H10K 59/124* (2023.02); *H10K 59/131* (2023.02); *G09G 2300/0876* (2013.01)

(58) Field of Classification Search
CPC .............. G09G 3/3275; G09G 3/3258; G09G 2300/0876; H01L 27/3258; H01L 27/3276
See application file for complete search history.

(56) References Cited

U.S. PATENT DOCUMENTS

2011/0057189 A1*  3/2011  Jeong ............... G06F 3/0421
                                              257/E21.414
2014/0291636 A1* 10/2014  Kim .................. H10K 59/1216
                                                      438/34
(Continued)

FOREIGN PATENT DOCUMENTS

JP      2019-204967 A    11/2019
KR    10-0684514 B1     2/2007
(Continued)

OTHER PUBLICATIONS

Korean Office Action dated Nov. 1, 2023 issued in Patent Application No. 10-2020-0150906 w/English Translation (21 pages).

*Primary Examiner* — Patrick N Edouard
*Assistant Examiner* — Eboni N Giles
(74) *Attorney, Agent, or Firm* — POLSINELLI PC

(57) ABSTRACT

A display panel includes a first metal layer; a first insulating layer covering the first metal layer; a semiconductor layer disposed on the first insulating layer; a second insulating layer disposed on the first insulating layer to cover the semiconductor layer; and a second metal layer disposed on the second insulating layer, wherein the first metal layer comprises a bottom gate electrode of a driving element, wherein the second metal layer comprises a top gate electrode of the driving element connected to the bottom gate electrode through a first contact hole penetrating the second insulating layer and the first insulating layer, wherein the semiconductor layer comprises a semiconductor channel of the driving element overlapping with the top gate electrode and the bottom gate electrode.

20 Claims, 12 Drawing Sheets

(51) Int. Cl.
*H10K 59/124* (2023.01)
*H10K 59/131* (2023.01)

(56) References Cited

U.S. PATENT DOCUMENTS

| | | | |
|---|---|---|---|
| 2018/0212061 A1* | 7/2018 | Xie | H01L 27/124 |
| 2019/0027092 A1* | 1/2019 | Matsueda | H10K 50/818 |
| 2019/0172882 A1* | 6/2019 | Nam | G06F 3/0412 |
| 2021/0210014 A1* | 7/2021 | Kim | G09G 3/2007 |
| 2021/0217359 A1* | 7/2021 | Kishimoto | H01L 29/786 |
| 2021/0335242 A1* | 10/2021 | Kim | G09G 3/3233 |
| 2021/0343238 A1* | 11/2021 | Okabe | G09G 3/3275 |

FOREIGN PATENT DOCUMENTS

| | | |
|---|---|---|
| KR | 10-2011-0026764 A | 3/2011 |
| KR | 10-2019-0065851 A | 6/2019 |
| KR | 10-2020-0015862 A | 2/2020 |
| KR | 10-2020-0079894 A | 7/2020 |
| WO | 2020/066024 A1 | 4/2020 |

* cited by examiner

DISPLAY PANEL AND DISPLAY DEVICE USING THE SAME

CROSS-REFERENCE TO RELATED APPLICATION

This application claims priority to and the benefit of Korean Patent Application No. 10-2020-0150906, filed on Nov. 12, 2020, which is hereby incorporated by reference in its entirety.

BACKGROUND

Field of the Disclosure

The present disclosure relates to a display panel and a display device using the same.

Description of the Background

Electroluminescent display devices may be classified into inorganic light emitting display devices and organic light emitting display devices depending on the material of the emission layer. The organic light emitting display device of an active matrix type includes an organic light emitting diode (hereinafter, referred to as "OLED") that emits light by itself, and has an advantage in that the response speed is fast, and the luminous efficiency and luminance are good, and the viewing angle is wide. In the organic light emitting display device, an organic light emitting diode (OLED) is formed in each pixel. The organic light emitting display device has a fast response speed, is excellent in terms of luminous efficiency, luminance and viewing angle, and provides an excellent contrast ratio and color reproducibility since it can express black gradations in complete black.

The organic light emitting display device does not require a backlight unit, and may be implemented on a plastic substrate, a thin glass substrate, or a metal substrate, which is a flexible material. Therefore, the flexible display may be implemented as an organic light emitting display device.

Each of the pixels of an organic light emitting display device includes a driving element that drives a light emitting element. The driving element supplies a current to the light emitting element according to the gate-source voltage Vgs. Various methods are being attempted to increase the current capability of the driving element.

Crosstalk may occur due to parasitic capacitance between signal/power lines formed in the pixel array.

A pixel circuit may be formed in each of the pixels. The pixel circuit has a structure in which a plurality of thin film layers including metal layers and insulating layers are stacked. It is difficult to design a pixel circuit that can increase the aperture ratio of pixels due to a large number of contact holes that penetrate insulating layers and connect metal layers or metal and semiconductor layers at major nodes.

SUMMARY

Accordingly, the present disclosure is to solve the aforementioned necessity and/or problem.

The present disclosure provides a display panel that can improve the current capability of a driving element, prevent crosstalk, and reduce the number of required contact holes, and a display device using the same.

The present disclosure is not limited to the above-described and other features of the present disclosure will be apparent to those skilled in the art from the following descriptions.

A display panel according to an aspect of the present disclosure includes: a first metal layer; a first insulating layer covering the first metal layer; a semiconductor layer disposed on the first insulating layer; a second insulating layer disposed on the first insulating layer to cover the semiconductor layer; and a second metal layer disposed on the second insulating layer. The first metal layer includes a bottom gate electrode of a driving element. The second metal layer includes a top gate electrode of the driving element connected to the bottom gate electrode through a first contact hole penetrating the second insulating layer and the first insulating layer. The semiconductor layer includes a semiconductor channel of the driving element overlapping with the top gate electrode and the bottom gate electrode.

A display panel according to another aspect of the present disclosure includes: a driving element to supply a current to a light emitting element; a first switch element to connect a data line through which a data voltage is applied to a gate electrode of the driving element in response to a gate signal from a gate line; a second switch element to apply a reference voltage to a source electrode of the driving element in response to the gate signal; and a capacitor connected between the gate electrode of the driving element and the source electrode of the driving element. The gate electrode of the driving element includes a top gate electrode and a bottom gate electrode, the top gate electrode overlapping with the bottom gate electrode, with a semiconductor layer including a semiconductor channel interposed therebetween. The top gate electrode is in contact with the bottom gate electrode through a first contact hole penetrating a first insulating layer between the bottom gate electrode and the semiconductor layer and a second insulating layer between the top gate electrode and the semiconductor layer. The anode electrode of the light emitting element is in contact with the semiconductor layer through a second contact hole penetrating a third insulating layer covering the driving element and the switch elements and a planarization layer disposed on the third insulating layer.

A display device according to an aspect of the present disclosure includes: a display panel in which a plurality of data lines, a plurality of gate lines crossing the data lines, a plurality of first power lines through which a pixel driving voltage is applied, a plurality of second power lines through which a reference voltage is applied, and a plurality of pixels are arranged; a data driver configured to supply a data voltage of pixel data through the data lines; and a gate driver configured to supply a gate signal through the gate lines, wherein each of the pixels comprises: a driving element configured to supply a current to a light emitting element; a first switch element configured to connect the data line through which the data voltage is applied to a gate electrode of the driving element in response to the gate signal from the gate line; a second switch element configured to apply the reference voltage lower than the pixel driving voltage to a source electrode of the driving element in response to the gate signal; and a capacitor connected between the gate electrode of the driving element and the source electrode of the driving element, wherein the gate electrode of the driving element comprises a top gate electrode and a bottom gate electrode, the top gate electrode overlapping with the bottom gate electrode, with a semiconductor layer including a semiconductor channel interposed therebetween, wherein the top gate electrode is in contact with the bottom gate electrode through a first contact hole penetrating a first insulating layer between the bottom gate electrode and the semiconductor layer and a second insulating layer between the top gate electrode and the semiconductor layer, and wherein an anode electrode of the light emitting element is in contact with the semiconductor layer through a second contact hole penetrating a third insulating layer covering the driving element and the first and second switch elements and a planarization layer disposed on the third insulating layer.

The present disclosure can improve the current capability of a driving element by implementing the gate electrode of the driving element driving a light emitting element in a double gate structure.

In the present disclosure, the number of contact holes connecting major nodes of a pixel circuit can be reduced by optimizing the planar and cross-sectional structures of the pixel circuit. As a result, the present disclosure can reduce the loss of the aperture ratio due to contact holes arranged in the pixel circuit.

In the present disclosure, a slit covered by the anode electrode is formed between the bottom gate electrode of a driving element and the data line to remove the parasitic capacitance between the neighboring bottom gate electrode and the data line, preventing crosstalk.

In the present disclosure, a slit is formed between the bottom gate electrode of a driving element and the data line to thereby prevent a short circuit between the neighboring bottom gate electrode and the data line and remove the parasitic capacitance.

Effects which can be achieved by the present disclosure are not limited to the above-mentioned effects. That is, other features that are not mentioned may be obviously understood by those skilled in the art to which the present disclosure pertains from the following description.

BRIEF DESCRIPTION OF THE DRAWINGS

The above and other features and advantages of the present disclosure will become more apparent to those of ordinary skill in the art by describing exemplary aspects thereof in detail with reference to the attached drawings, in which.

DETAILED DESCRIPTION

Figure 1:
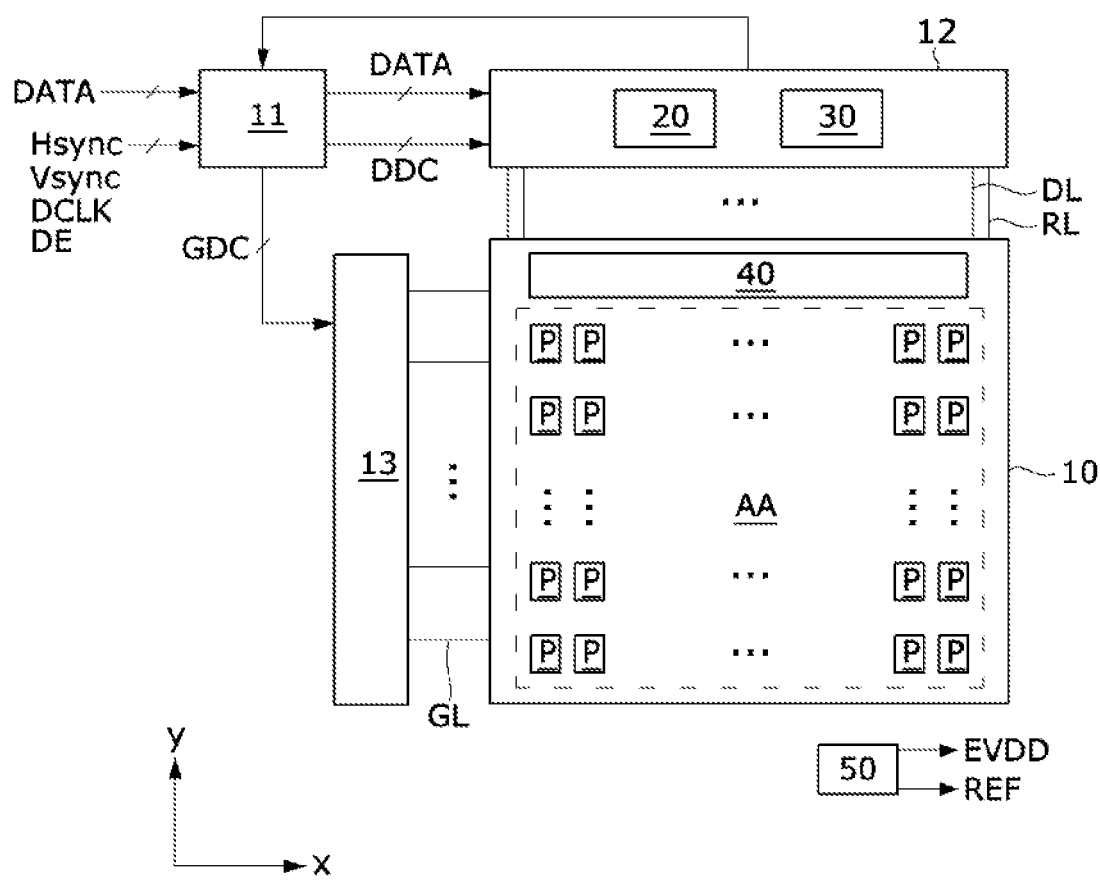
FIG. 1 is a block diagram schematically illustrating a display device according to an aspect of the present disclosure.

The advantages and features of the present disclosure and methods for accomplishing the same will be more clearly understood from aspects described below with reference to the accompanying drawings. However, the present disclosure is not limited to the following aspects but may be implemented in various different forms. Rather, the present aspects will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the aspects of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having," used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following aspects can be partially or entirely bonded to or combined with each other and can be linked and operated in technically various ways. The aspects can be carried out independently of or in association with each other.

In a display device of the present disclosure, a pixel circuit may include at least one of an n-channel transistor and a p-channel transistor. Transistors may be implemented as oxide thin film transistors (oxide TFTs) including an oxide semiconductor, low temperature polysilicon (LTPS) TFTs including low temperature polysilicon, or the like. Further, each of the transistors may be implemented as a p-channel TFT or an n-channel TFT. In aspects, descriptions will be given based on an example in which the transistors of the pixel circuit are implemented as the p-channel TFTs, but the present disclosure is not limited thereto.

A transistor is a three-electrode element including a gate, a source, and a drain. The source is an electrode that supplies carriers to the transistor. In the transistor, carriers start to flow from the source. The drain is an electrode through which carriers exit from the transistor. In a transistor, carriers flow from a source to a drain. In the case of an n-channel transistor, since carriers are electrons, a source voltage is a voltage lower than a drain voltage such that electrons may flow from a source to a drain. The n-channel transistor has a direction of a current flowing from the drain to the source. In the case of a p-channel transistor (p-channel metal-oxide semiconductor (PMOS), since carriers are holes, a source voltage is higher than a drain voltage such that holes may flow from a source to a drain. In the p-channel transistor, since holes flow from the source to the drain, a current flows from the source to the drain. It should be noted that a source and a drain of a transistor are not fixed. For example, a source and a drain may be changed according to an applied voltage. Therefore, the disclosure is not limited due to a source and a drain of a transistor. In the following description, a source and a drain of a transistor will be referred to as a first electrode and a second electrode.

A gate signal swings between a gate-on voltage and a gate-off voltage. The gate-on voltage is set to a voltage higher than a threshold voltage of a transistor, and the gate-off voltage is set to a voltage lower than the threshold voltage of the transistor. A transistor is turned on in response to a gate-on voltage and is turned off in response to a gate-off voltage. In the case of an n-channel transistor, a gate-on voltage may be a gate high voltage VGH, and a gate-off voltage may be a gate low voltage VGL. In the case of a p-channel transistor, a gate-on voltage may be the gate low voltage VGL, and a gate-off voltage may be the gate high voltage VGH.

The driving element of the pixel circuit may be implemented as a transistor. Although electrical characteristics between pixels should be uniform among all pixels, there may be differences between pixels due to process variations and device characteristics variations. The electrical characteristics of the pixels may deteriorate with the lapse of display driving time. In order to compensate for the electrical characteristic deviation between the pixels, the display device of the present disclosure may include an external compensation circuit. The external compensation circuit may sense the threshold voltage and/or mobility of the driving element through a sensing switch element in each of the pixel circuits, and a REF line (or sensing line) connected to the sensing switch element, and transmit it to an external compensator. The compensator compensates for electrical characteristic deviation and deterioration between pixels by modulating pixel data of an input image based on a sensing result of each of the sub-pixels.

Hereinafter, various aspects of the present disclosure will be described in detail with reference to the accompanying drawings.

Figure 2:
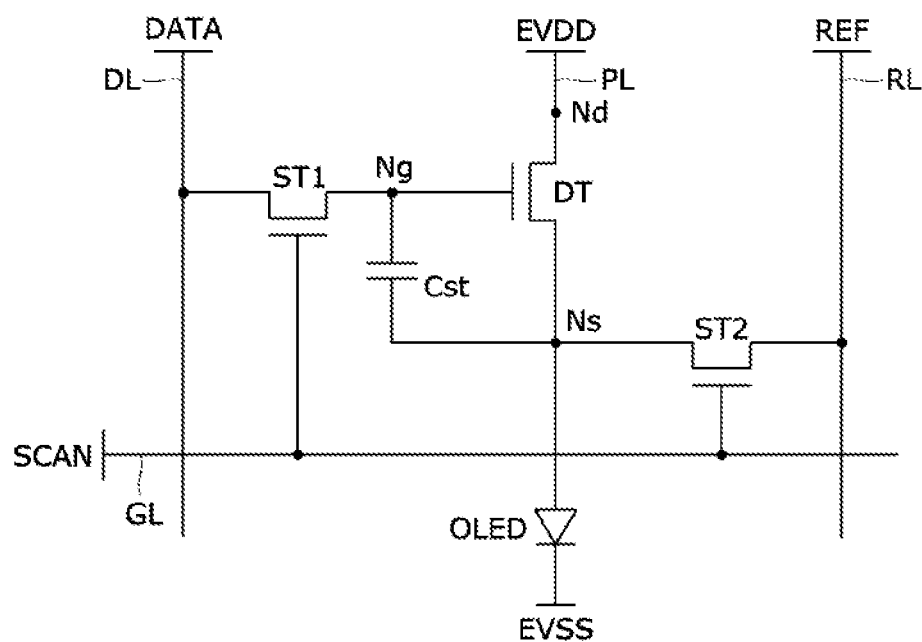
FIG. 2 is a circuit diagram showing an example of a pixel circuit.

With reference to FIG. 1 and FIG. 2, the display device of the present disclosure includes a display panel 10, and a display panel driver for writing pixel data to pixels of the display panel 10.

The display panel driver includes a data driver 12, a gate driver 13, and a timing controller 11.

The screen of the display panel 10 includes a pixel array AA on which an input image is displayed. In the pixel array AA, a plurality of data lines DL, a plurality of gate lines GL crossing the data lines DL, a plurality of REF lines RL parallel to the data lines DL, and a plurality of pixels P arranged in a matrix form are disposed.

Each of the pixels P may be divided into a red subpixel, a green subpixel, and a blue subpixel for color implementation. Each pixel may further include a white subpixel. Each of the subpixels may include a pixel circuit shown in FIG. 2.

Each of the subpixels is connected to one of the data lines DL through which the data voltage is supplied, to one of the REF lines RL through which the reference voltage REF is supplied, and to one of the gate lines GL. In addition, each of the subpixels is connected to the VDD line PL through which the pixel driving voltage EVDD is supplied, and is supplied with a low-potential power voltage EVSS through the VSS electrode.

The data driver 12 includes a data channel unit 20 that supplies a data voltage to the data lines DL of the display panel 10, and a sensing channel unit 30 that is connected to the pixel circuit of each of the subpixels to sense driving characteristics of the pixel circuit in real time.

The data channel unit 20 includes a plurality of digital-to-analog converters (hereinafter referred to as "DAC") disposed on each of the channels. In the display mode, the DAC of the data channel unit 20 converts the pixel data DATA input from the timing controller 11 into a gamma compensation voltage for each gray level to output a data voltage Vdata. In the sensing mode, the data channel unit 20 outputs a data voltage Vdata for sensing under the control of the timing controller 11. The data voltage Vdata output from each of the channels of the data channel unit 20 may be directly applied to the data lines DL or may be applied to the data lines DL through a switch unit 40.

The display panel 10 may further include a switch unit 40. The switch unit 40 may include a demultiplexer DEMUX connected between channels through which a data voltage is output from the data channel unit 20 and the data lines DL. The demultiplexer may reduce the number of channels of the data channel unit 20 by distributing the data voltage output from each of the channels of the data channel unit 20 to two or more data lines DL in a time division manner.

The sensing channel unit 30 includes a sampling circuit and integrator connected to the REF lines RL, and an analog-to-digital converter (hereinafter referred to as "ADC") that converts the output voltage of the integrator into sensing data (digital data). The sensing data is transmitted to the compensation unit of the timing controller 11.

The gate driver 13 may be implemented as a gate-in-panel GIP circuit formed directly on the bezel region of the display panel 10 together with the TFT array of the pixel array. The gate driver 13 outputs a gate signal to the gate lines GL under the control of the timing controller 11. The gate driver 13 may shift the gate signal by using a shift register to sequentially supply the signals to the gate lines GL. The voltage of the gate signal swings between the gate-off voltage and the gate-on voltage. The gate driver 13 may be disposed on each of the left and right bezels of the display panel 10 to supply a gate signal to the gate lines GL in a double feeding scheme. In the double feeding scheme, the gate drivers 13 on both sides may be synchronized under the control of the timing controller 11, so that gate signals can be applied to both ends of one gate line at the same time. In another aspect, the gate driver 13 may be disposed on one of the left and right bezels of the display panel 10 to supply a gate signal to the gate lines GL in a single feeding scheme.

The timing controller 11 modulates the pixel data of the input image based on the sensing data received from the sensing channel unit 30 and transmits it to the data channel unit 20 of the data driver 12, and controls the data channel unit 20 and the gate driver 13.

The timing controller 11 receives pixel data DATA of an input image and a timing signal synchronized with the pixel data from the host system. The timing signal may include a vertical synchronization signal Vsync, a horizontal synchronization signal Hsync, a main clock DCLK, and a data enable signal DE. One cycle of the vertical synchronization signal Vsync is one frame period. One cycle of the horizontal synchronization signal Hsync and the data enable signal DE is one horizontal period (1H). The pulse of the data enable signal DE is synchronized with one line data to be written to the pixels of one pixel line. As the frame period and the horizontal period can be known by counting the data enable signal DE, the vertical synchronization signal Vsync and the horizontal synchronization signal Hsync may be omitted.

The timing controller 11 may multiply the input frame frequency (Hz) by i (i being a positive integer greater than 0) to generate control signals (DDC, GDC) of a frame frequency set to input frame frequency×i (Hz) for controlling the operation timing of the data driver 12, the gate driver 13, and the switch unit 40. The input frame frequency is 60 Hz in the National Television Standards Committee (NTSC) system and is 50 Hz in the Phase-Alternating Line (PAL) system. The timing controller 11 may lower the frame frequency to a frequency between 1 Hz and 30 Hz in order to lower the refresh rate of pixels in a low speed driving mode.

The voltage level of the gate timing control signal output from the timing controller 11 may be shifted through a level shifter (not shown). The gate timing signal may include a start pulse, a shift clock, or the like. The level shifter may convert a low level voltage of the gate timing control signal into a gate low voltage, and may convert a high level voltage of the gate timing control signal into a gate high voltage. The shift register of the gate driver 13 receives a gate timing control signal, generates a gate signal, and shifts the gate signal.

The timing controller 11 may control a sensing mode for sensing electrical characteristics of the driving element DT at each of the subpixels and updating a compensation value accordingly, and control a display mode for displaying pixel data of an input image at which the compensation value is reflected. The timing controller 11 may control the data driver 12, the gate driver 13 and the switch unit 40 to separate the sensing mode and the display mode according to a predetermined sequence, but the present disclosure is not limited thereto. For example, the sensing mode may be performed during a vertical blank period of the display mode in which an input image is displayed on the pixels, may be performed during a power-on sequence period when application of power to the display device is started, or may be performed during a power-off sequence period before power is completely discharged after the display device is powered off. The vertical blank period is a period in which pixel data DATA of the input image is not written to the pixels. The vertical blank period is allocated between vertical active periods in which one frame of pixel data DATA is written. The power-on sequence period includes a transient period until the input image is displayed on the pixel array AA after application of power to the display device is started. The power-off sequence period includes a transient period until the power of the display device is completely cut off after data addressing of pixels is completed.

The compensation unit of the timing controller 11 may include a look-up table for compensation (or compensation lookup table). This lookup table stores compensation values for compensating the threshold voltage Vth and the mobility μ of the driving element DT for each subpixel. To compensate for changes in electrical characteristics of the driving element DT at each of the subpixels, the compensation unit inputs the sensing data received from the ADC of the sensing channel unit 30 to the compensation lookup table, and modulates the pixel data of the input image by adding or multiplying the compensation value output from the compensation lookup table and the pixel data.

The data driver 12 and the gate driver 13 may operate in a low speed driving mode under the control of the timing controller 11. In the low speed driving mode, power consumption of the display device can be reduced when the input image does not change for a preset time as a result of analyzing the input image. In the low speed driving mode, when a still image is input for a preset time or longer, the refresh rate of the pixels is lowered to control the data write cycle of the pixels to be longer, thereby reducing power consumption. The low speed driving mode is not limited to when a still image is input. For example, when the display device operates in a standby mode or when a user command or an input image is not input to the display panel driver for a preset time or longer, the display panel driver may operate in the low speed driving mode.

The host system may be one of a television (TV) system, a set-top box, a navigation system, a personal computer (PC), a home theater system, a mobile device, a wearable device, and a vehicle system.

The display device further includes a power supply 50. The power supply 50 may include a charge pump, a regulator, a buck converter, a boost converter, a programmable gamma IC, and the like. The power supply 50 adjusts the DC input voltage from the host system to generate power required for driving the display panel driver and the display panel 10. The power supply 50 may output a DC voltage, such as gamma reference voltage, gate low voltage, gate high voltage, pixel driving voltage EVDD, low-potential power voltage EVSS, or reference voltage REF. The pulse of the gate signal swings between the gate high voltage and the gate low voltage. The gamma reference voltage is applied to the voltage divider circuit of the data channel unit 20. The voltage divider circuit divides the gamma reference voltage to output a gamma compensation voltage for each gray level. The gamma compensation voltage for each gray level is supplied to the DAC of the data channel unit 20. The programmable gamma IC may change the voltage level of each gamma reference voltage according to a register setting.

As shown in FIG. 2, the pixel circuit is connected to the data line DL through which the data voltage of the pixel data DATA is supplied, to the REF line RL through which the reference voltage REF is supplied, and to the gate line GL through which the gate signal SCAN is supplied. The reference voltage REF may be set to a DC voltage lower than the pixel driving voltage EVDD and lower than or equal to the low-potential power voltage EVSS.

The pixel circuit includes a light emitting element OLED, a driving element DT, a first switch element ST1, a second switch element ST2, and a storage capacitor Cst. Each of the driving element DT and the switch elements ST1 and ST2 may be implemented with a transistor.

The light emitting element OLED may be implemented with an OLED including an organic compound layer formed between the anode electrode and the cathode electrode. The organic compound layer may include, but not limited to, a hole injection layer (HIL), a hole transport layer (HTL), an emission layer (EML), an electron transport layer (ETL), and an electron injection layer (EIL). The light emitting element OLED is connected between a third node Ns connected to the source electrode of the driving element DT and the VSS electrode to which the low-potential power voltage EVSS is applied. The light emitting element OLED is driven by a current generated by the gate-source voltage Vgs of the driving element DT to emit light.

The driving element DT includes a gate electrode connected to a first node Ng, a drain electrode connected to a second node Nd, and a source electrode connected to a third node Ns. The source electrode of the driving element DT is connected to the anode electrode of the light emitting element OLED through the third node Ns. The driving element DT drives the light emitting element OLED by controlling the amount of current applied to the light emitting element OLED according to the gate-source voltage Vgs. The pixel driving voltage EVDD may be applied to the drain electrode of the driving element DT.

The first switch element ST1 includes a gate electrode connected to the gate line GL, a drain electrode connected to the data line DL, and a source electrode connected to the first node Ng. The first switch element ST1 is turned on in response to a pulse of the gate signal SCAN from the gate line GL. When the first switch element ST1 is turned on, the data line DL through which the data voltage of the pixel data DATA is applied is connected to the first node Ng, and the data voltage is applied to the gate electrode of the driving element DT and the storage capacitor Cst.

The second switch element ST2 includes a gate electrode connected to the gate line GL, a drain electrode connected to the REF line RL, and a source electrode connected to the third node Ns. The second switch element ST2 is turned on in response to a pulse of the gate signal SCAN from the gate line GL and connects the REF line RL and the third node Ns. When the second switch element ST2 is turned on, the reference voltage REF is applied to the third node Ns. When the second switch element ST2 is turned on in the sensing mode, the electrical characteristics of the driving element DT may be sensed by the current flowing through the third node Ns. The REF line RL is connected to the sensing channel unit 30 and the current flowing through the third node Ns is supplied to the sensing channel unit 30.

The storage capacitor Cst is connected between the first node Ng and the third node Ns and maintains the gate-source voltage Vgs of the driving element DT during the emission period of the pixel P. When the gate-source voltage Vgs increases, the amount of current flowing through the light-emitting element OLED increases, so that the luminance of the pixel P increases. The luminance of the pixel P increases in proportion to the magnitude of the voltage applied to the first node Ng, that is, the data voltage Vdata.

The gate electrode of the driving element DT may be implemented in a double gate structure. In a transistor having a double gate structure, as carriers flow on both sides of the semiconductor channel, the mobility of the carrier is increased. The driving element DT operates in the saturation region and supplies a current to the light emitting element OLED. In case that the driving element DT is implemented in a double gate structure, when operating in the saturation region, the current flowing between the drain and the source of the driving element DT may increase by about three times in comparison to the single gate structure.

The switch elements ST1 and ST2 may be implemented in a single gate structure or a double gate structure. The switch elements ST1 and ST2 operate in the linear region. When the switch elements ST1 and ST2 are implemented in a double gate structure, the mobility of carriers flowing through the semiconductor channel increases. As the switch elements ST1 and ST2 operate in the linear region, the amount of current increases by about 1.5 times.

When the switch elements ST1 and ST2 on the display panel 10 are fabricated in a double gate structure, the parasitic capacitance connected to the gate line and the switch elements ST1 and ST2 may increase, and they may become more susceptible to a variation in line-width distribution or a variation in critical dimension (CD) in the manufacturing process. Hence, the switch elements ST1 and ST2 may be designed in a single gate structure or a double gate structure in consideration of the effect of improving the current capability of the switch elements ST1 and ST2, the gate-drain parasitic capacitance Cgd between pixels due to line-width variations, and the non-uniformity of the gate-source parasitic capacitance Cgs.

Figure 3:
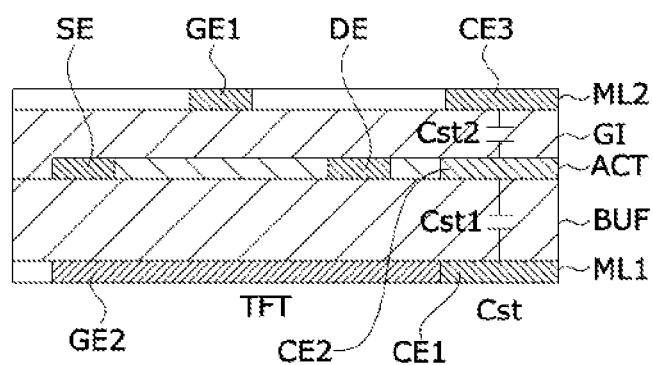
FIG. 3 is a cross-sectional view schematically illustrating a cross-sectional structure of the pixel circuit in the display device according to an aspect of the present disclosure.

FIG. 3 is a cross-sectional view schematically illustrating a cross-sectional structure of the pixel circuit in the display device according to an aspect of the present disclosure.

With reference to FIG. 3, the cross-sectional structure of the pixel circuit includes a first metal layer ML1 disposed on the substrate of the display panel 10, a buffer layer BUF covering the first metal layer ML1, a semiconductor layer ACT disposed on the buffer layer BUF, a gate insulating layer GI disposed on the buffer layer BUF to cover the semiconductor layer ACT, and a second metal layer ML2 disposed on the gate insulating layer GI.

The buffer layer BUF and the gate insulating layer GI are insulating layers made of an insulating material, for example, an inorganic insulating material such as $SiO_2$ or $SiN_x$.

The first metal layer ML includes the data line DL, the bottom gate electrode GE2 of the transistor TFT, the bottom electrode CE1 of the capacitor Cst, the VDD line PL, the REF line RL, and the like. In FIG. 3, the power lines PL and RL are omitted.

The bottom gate electrode GE2 of the transistor TFT is disposed under the semiconductor channel of the transistor TFT, and serves also as a light shield layer that blocks external light so that light is not irradiated to the semiconductor channel.

The top gate electrode GE1 of the transistor TFT may be formed of metal patterns separated through patterning from the second metal layer ML2 disposed on the gate insulating layer GI. Here, the transistor TFT disposed on the bottom gate electrode GE2 may be the driving element DT shown in FIG. 2. The gate electrode of each of the first and second switch elements ST1 and ST2, which are omitted in the drawing, may be formed of metal patterns patterned from the second metal layer.

The second metal layer ML2 further includes a gate line GL connected to the gate electrodes of the switch elements ST1 and ST2. The second metal layer ML2 may further include the top electrode CE3 of the storage capacitor Cst.

The semiconductor layer ACT includes the source electrode SE and drain electrode DE of the transistor TFT, the semiconductor channel of the transistor TFT, and the intermediate electrode CE2 of the storage capacitor Cst. The semiconductor layer ACT may be metalized at least some portions, for example, the source electrode and drain electrode of the transistor TFT, a portion connected to the second metal layer pattern, and the intermediate electrode portion of the storage capacitor Cst. The semiconductor layer ACT is not metalized at the semiconductor channel defined under the gate electrode GE1 of the transistor TFT.

In the case of indium gallium zinc oxide (IGZO) being a representative oxide semiconductor, the conduction characteristics vary depending on the oxygen content. When the oxygen content decreases, the conductivity of the oxide semiconductor (IGZO) increases and it is metalized. As a method of reducing the oxygen content of the oxide semiconductor (IGZO), plasma treatment may be used. For example, when the oxide semiconductor is exposed to plasma (metallization process), oxygen contained in the oxide semiconductor is removed and the resistance of the oxide semiconductor (IGZO) is lowered, so that the oxide semiconductor may be metalized. Plasma treatment is a method of generating plasma discharge in helium (He), hydrogen ($H_2$), or argon (Ar) gas. In a dry etching process of a thin film layer positioned on the semiconductor layer ACT, the exposed portion of the semiconductor layer ACT may be metalized.

A third metal layer (MA in FIG. 5) may be partially formed on the semiconductor layer ACT. The third metal layer formed on the semiconductor layer ACT and the top gate electrode GE1 of the transistor act as a mask in the metallization process of the semiconductor layer ACT, so that the semiconductor layer ACT under the third metal layer and the gate electrode GE1 is not metalized. The third metal layer is in contact with the semiconductor layer ACT in between the first metal layer ML1 and the second metal layer ML2.

After the semiconductor layer ACT and the third metal layer are stacked on the buffer layer BUF, they may be collectively patterned in a photolithography process (hereinafter referred to as a "photo process") using a half-tone mask to be formed on the same line.

The source electrode and drain electrode of the transistor TFT and the intermediate electrode CE2 of the storage capacitor Cst may be formed of the metalized portion of the semiconductor layer ACT or the third metal layer as described above. The storage capacitor Cst may include a first capacitor Cst1 between the bottom electrode CE1 and the intermediate electrode CE2, and a second capacitor Cst2 between the intermediate electrode CE2 and the top electrode CE3. As such, the storage capacitor Cst may have an increased capacity by using the two capacitors Cst1 and Cst2. The size of the electrode of the storage capacitor Cst may be reduced without reducing the capacity required by the storage capacitor Cst. Hence, as the size of the storage capacitor Cst is reduced, the aperture ratio of the pixels P may be improved.

Figure 4:
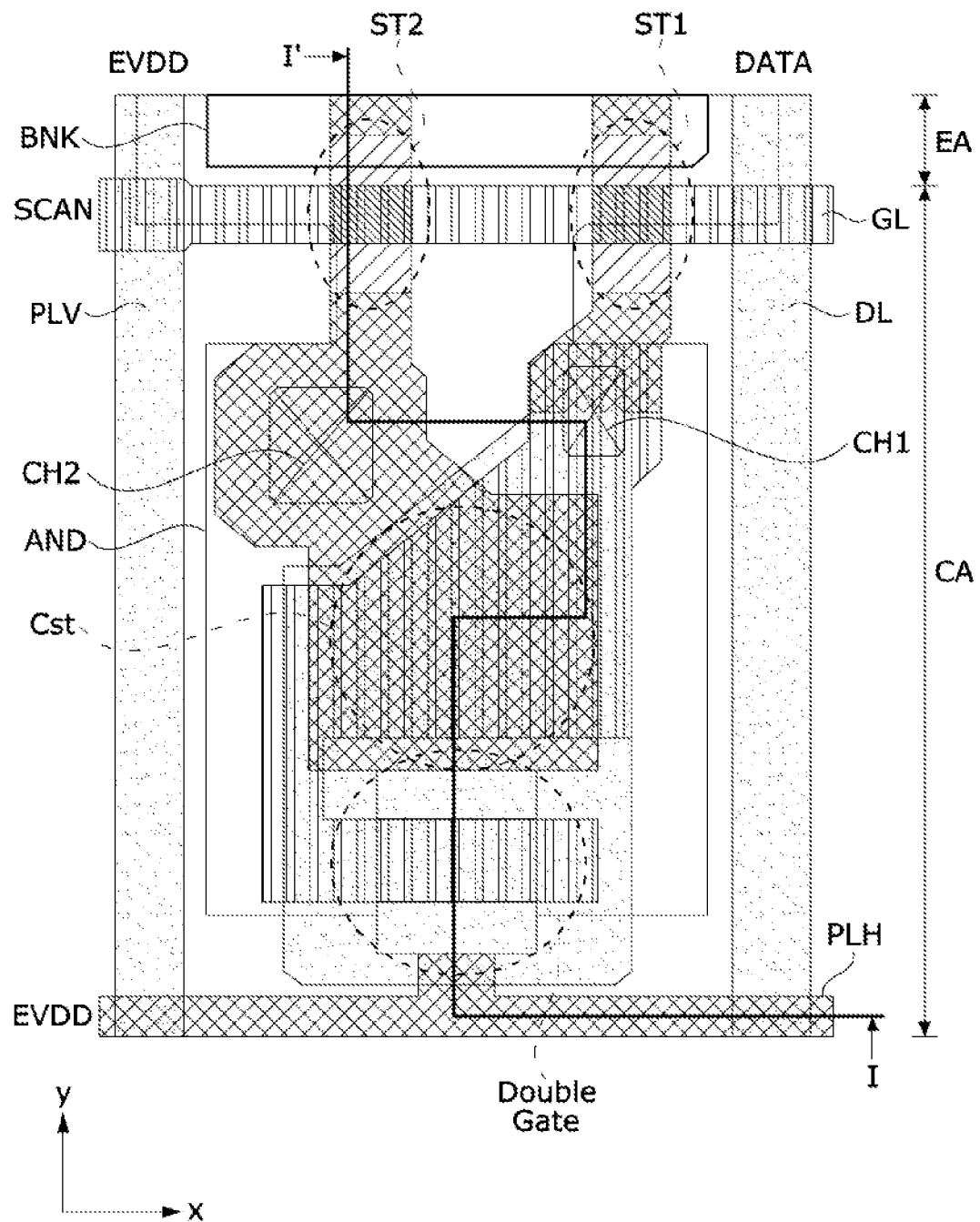
FIG. 4 is a plan view showing a pixel circuit of one subpixel in a display panel according to an aspect of the present disclosure.
Figure 5:
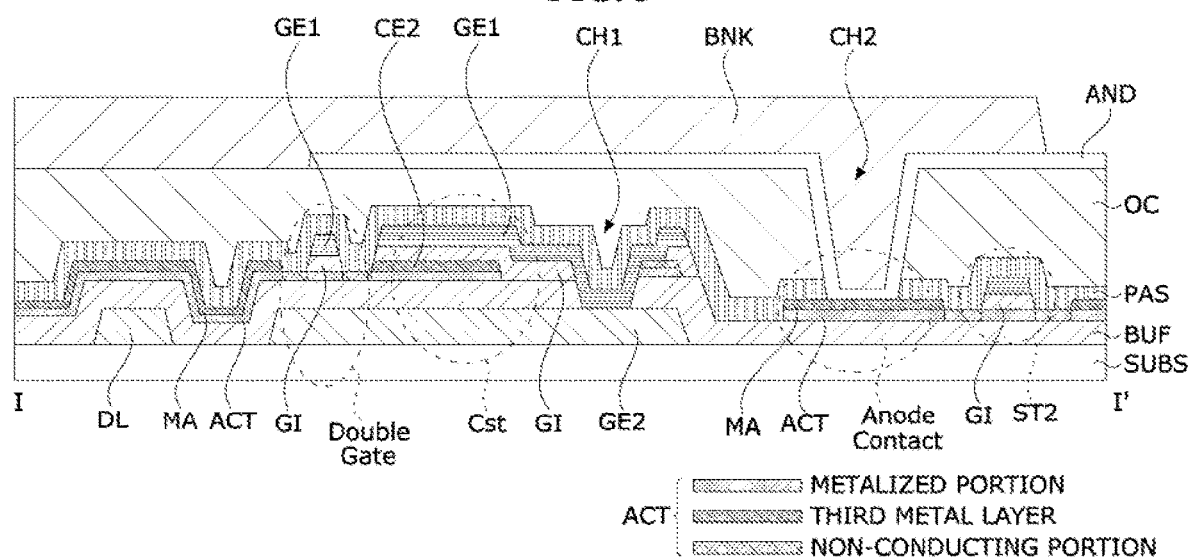
FIG. 5 is a cross-sectional view illustrating a cross-sectional structure of the pixel circuit taken along line I-I' in FIG. 4.

FIG. 4 is a plan view showing a pixel circuit of one subpixel in a display device according to an aspect of the present disclosure. FIG. 5 is a cross-sectional view illustrating a cross-sectional structure of the pixel circuit taken along line I-I' in FIG. 4.

With reference to FIGS. 4 and 5, each of the subpixels includes a light emitting section EA and a circuit section CA.

The light emitting section EA includes a light emitting element OLED. A color filter may be disposed in the light emitting section EA. Light of the light emitting element OLED is emitted to the outside through the light emitting region in the light emitting section EA. The light emitting region is defined by the pixel defining layer BNK. The pixel defining layer BNK covers the edge of the anode electrode AND of the light emitting element OLED. Meanwhile, the planar shape of the anode electrode AND may be formed in the same pattern as in FIG. 9, but is not limited thereto. In FIG. 4, only a part of the light emitting section EA adjacent to the circuit section CA is shown.

The circuit section CA includes the driving element DT for driving the light emitting element OLED, the first switch element ST1, the second switch element ST2, and the storage capacitor Cst. The light emitting element OLED is driven by the pixel circuit implemented in the circuit section CA.

When viewed from the cross-sectional structure of the pixel circuit, as shown in FIG. 5, the first metal layer is disposed on the substrate SUBS of the display panel 10. The buffer layer BUF is disposed on the substrate SUBS so as to cover the first metal layer. The buffer layer BUF may be formed of, but not limited to, an inorganic insulating material, for example, an oxide film such as $SiO_2$. The first metal layer may be formed of, but not limited to, copper/molitanium (Cu/MoTi) in which copper (Cu) and molitanium (MoTi) are stacked.

The first metal layer includes the data line DL, the first VDD line PLV, the REF line RL, the bottom gate electrode GE2, and the bottom electrode CE1 of the storage capacitor Cst. The first VDD line PLV is a first-first power line disposed along a first direction (y) parallel to the data line DL and the REF line RL. The first VDD line PLV crosses the second VDD line PLH with the buffer layer BUF interposed therebetween. The REF line RL is omitted in FIGS. 4 and 5.

The bottom gate electrode GE2 and the bottom electrode CE1 of the storage capacitor Cst may be an integrated single metal pattern. The bottom gate electrode GE2 is disposed on the driving element DT and the storage capacitor Cst so as to overlap with the top gate electrode GE1 and the semiconductor channel of the driving element DT. In another aspect, the light shield layer portion of the bottom gate electrode GE2 and the bottom electrode CE1 of the storage capacitor Cst may be formed of island patterns separated from the first metal layer.

The semiconductor layer ACT is disposed on the buffer layer BUF. The semiconductor layer ACT includes semiconductor channels, that is, active layers of the transistors DT, ST1 and ST2. The semiconductor channels of the transistors DT, ST1 and ST2 are not metalized. The semiconductor channel of the driving element DT is disposed between the gate insulating layer GI and the buffer layer BUF so as to overlap with the top gate electrode GE1 and the bottom gate electrode GE2. The semiconductor layer ACT is extended toward the storage capacitor Cst to include the intermediate electrode CE2 of the storage capacitor Cst. The intermediate electrode CE2 may be formed of the metalized portion of the semiconductor layer ACT or a third metal layer MA formed on the semiconductor layer ACT.

The semiconductor layer ACT may include the source and drain electrodes of the transistors DT, ST1 and ST2, portions connecting the electrodes of the transistors DT, ST1 and ST2, the metalized portion at the intermediate electrode CE2 of the storage capacitor Cst, and the second VDD line PLH applying the pixel driving voltage EVDD to the driving element DT. The second VDD line PLH is a first-second power line disposed along a second direction (x) parallel to the gate line GL. The second VDD line PLH may be connected to the first VDD line PLV through a contact hole omitted in the drawing. Hence, the pixel driving voltage EVDD applied to the first VDD line PLV is transmitted to the pixel circuit of the subpixel through the second VDD line PLH.

The third metal layer MA may be formed on the semiconductor layer ACT. The semiconductor layer ACT may be formed of, but not limited to, IGZO, and the metal layer MA may be formed of, but not limited to, MoTi. The third metal layer MA is in direct contact with the semiconductor layer ACT at a portion where metallization of the semiconductor layer ACT is needed. The source and drain electrodes of the transistors DT, ST1 and ST2 may be formed of the third metal layer MA on the semiconductor layer ACT. In this case, the semiconductor layer under the source and drain electrodes is not metalized.

The gate insulating layer GI covers the semiconductor layer ACT. The gate insulating layer GI may be, but not limited to, an oxide film such as silicon dioxide (SiO$_2$). The gate insulating layer GI is patterned to remain under the patterns of the second metal layer in a photo process. Hence, the gate insulating layer GI is disposed between the electrodes and the semiconductor channels of the transistors DT, ST1 and ST2.

The second metal layer is disposed on the gate insulating layer GI and is patterned in a photo process. The second metal layer includes the gate electrodes of the transistors DT, ST1 and ST2, the top electrode CE3 of the storage capacitor Cst, and the gate line GL. Hence, the top gate electrode GE1 of the driving element DT is formed of a second metal layer pattern disposed on the gate insulating layer GI.

The gate electrodes of the transistors DT, ST1 and ST2 disposed on the semiconductor layer ACT mask the semiconductor layer therebeneath in the metallization process of the semiconductor layer ACT. Hence, the semiconductor channels of the transistors DT, ST1 and ST2 are defined by the gate electrodes.

The top gate electrode GE1 and the bottom gate electrode GE2 of the driving element DT are connected through a first contact hole CH1 to thereby realize a double gate structure. The first contact hole CH1 penetrates the gate insulating layer GI and the buffer layer BUF to expose the bottom gate electrode GE2. The buffer layer BUF, the semiconductor layer ACT, and the gate insulating layer GI are stacked between the top gate electrode GE1 and the bottom gate electrode GE2.

The passivation layer PAS is an insulating layer disposed on the buffer layer BUF so as to cover the second metal layer and the semiconductor layer ACT. The passivation layer PAS may be formed of, but not limited to, an inorganic insulating material, for example, an oxide film such as SiO$_2$. The planarization layer OC is disposed on the passivation layer PAS. The planarization layer OC covers the driving element DT, the switch elements ST1 and ST2, and the storage capacitor Cst of the circuit section CA to planarize the surface. The planarization layer OC may be formed of, but not limited to, an organic material such as polyimide, benzocyclobutene series resin, or acrylate.

Components of the light emitting section EA are disposed on the planarization layer OC. The anode electrode AND of the light emitting element OLED is in contact with the metalized portion of the semiconductor layer ACT or the third metal layer MA through a second contact hole CH2 penetrating the passivation layer PAS and the planarization layer OC. The second contact hole CH2 penetrates the planarization layer OC and the passivation layer PAS to expose the metalized portion of the semiconductor layer ACT or the third metal layer MA.

The anode electrode AND of the light emitting element OLED is connected to the source electrode of the driving element DT, the intermediate electrode CE2 of the storage capacitor Cst, and the source electrode of the second switch element ST2 through the metalized portion of the semiconductor layer ACT or the third metal layer MA.

When viewed in the pixel emission direction, the display panel 10 may be implemented in a bottom emission method. In this case, the anode electrode AND may be formed on the planarization layer OC as a transparent electrode. For example, the anode electrode AND may be made of a transparent electrode material such as indium tin oxide (ITO), indium zinc oxide (IZO), or zinc oxide (ZnO).

The pixel defining layer BNK defining a light emitting region of each of the subpixels is disposed on the planarization layer OC so as to cover the anode electrode AND.

The pixel defining layer BNK is formed on the organic compound layer and the cathode electrode omitted in FIGS. 4 and 5. The organic compound layer is separated between neighboring subpixels by the pixel defining layer BNK, so that a light emitting region is defined for each subpixel. The cathode electrode of light emitting elements OLED is disposed on the organic compound layer. The cathode electrode may be formed over the entire pixel array AA and may be commonly connected between subpixels. In the bottom emission method, the cathode electrode may be implemented as a metal electrode having a high light reflectance. For example, the cathode electrode may be made of magnesium (Mg), calcium (Ca), aluminum (Al), silver (Ag), or an alloy thereof having a low work function.

The pixel circuit of the present disclosure includes two contact holes CH1 and CH2. In this pixel circuit, a contact hole connecting the semiconductor layer and the second metal layer pattern at the first node Ng of FIG. 2, and a contact hole connecting the semiconductor layer and the second metal layer pattern at the third node Ns of FIG. 2 are not required. Accordingly, the present disclosure can reduce the loss of the aperture ratio due to a large number of contact holes arranged in the pixel circuit.

Figure 6:
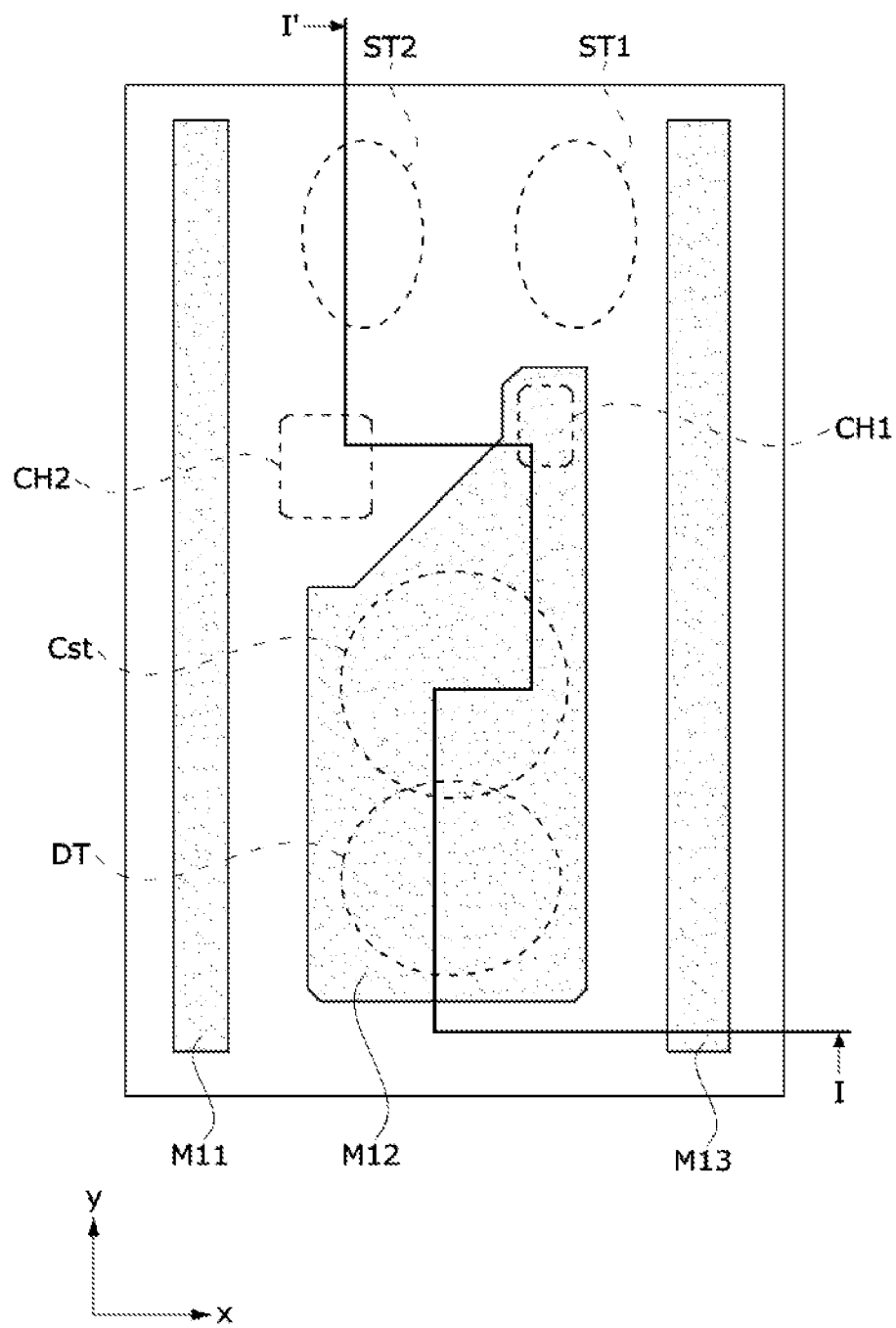
FIG. 6 is a plan view illustrating patterns of a first metal layer shown in FIG. 3.
Figure 7:
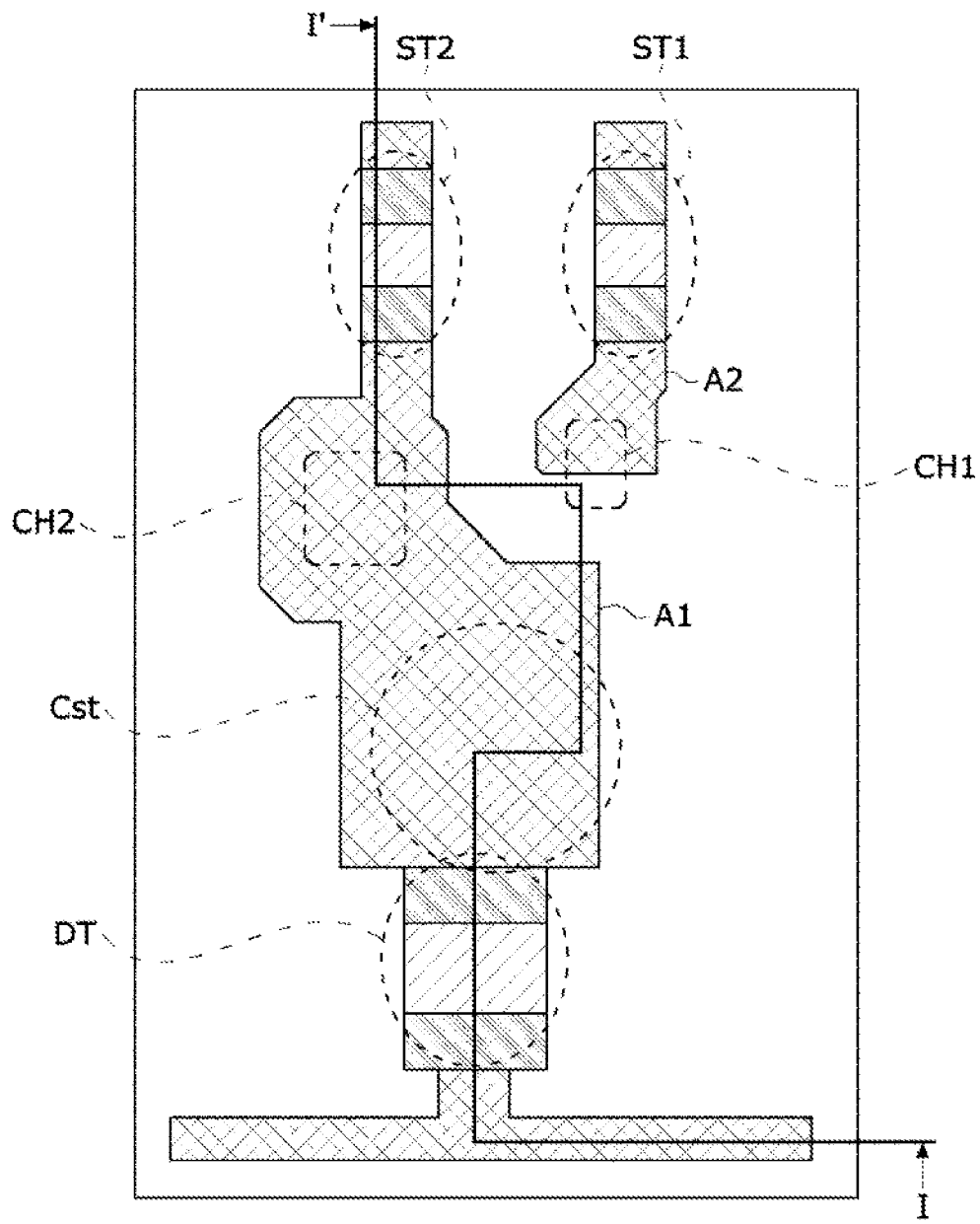
FIG. 7 is a plan view illustrating patterns of a semiconductor layer and a third metal layer shown in FIG. 5.
Figure 8:
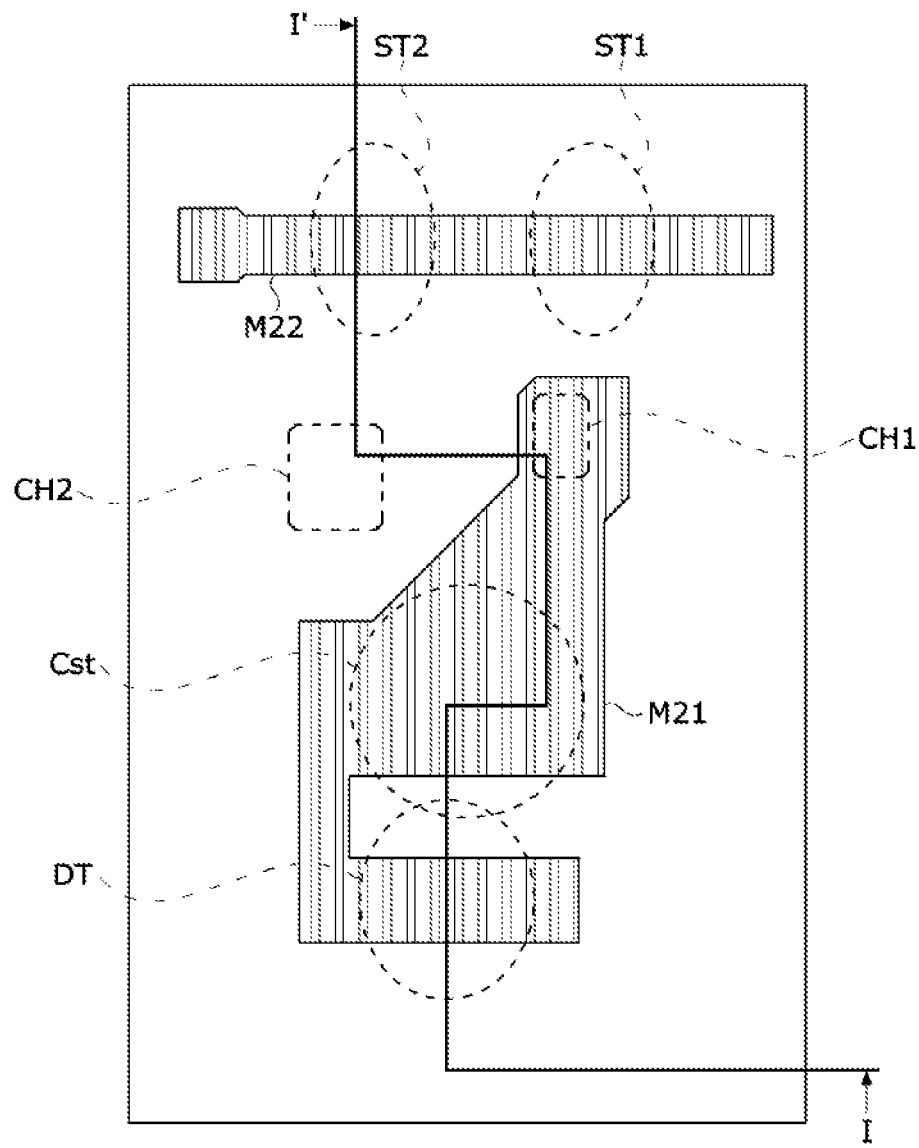
FIG. 8 is a plan view illustrating patterns of a second metal layer shown in FIG. 3.
Figure 9:
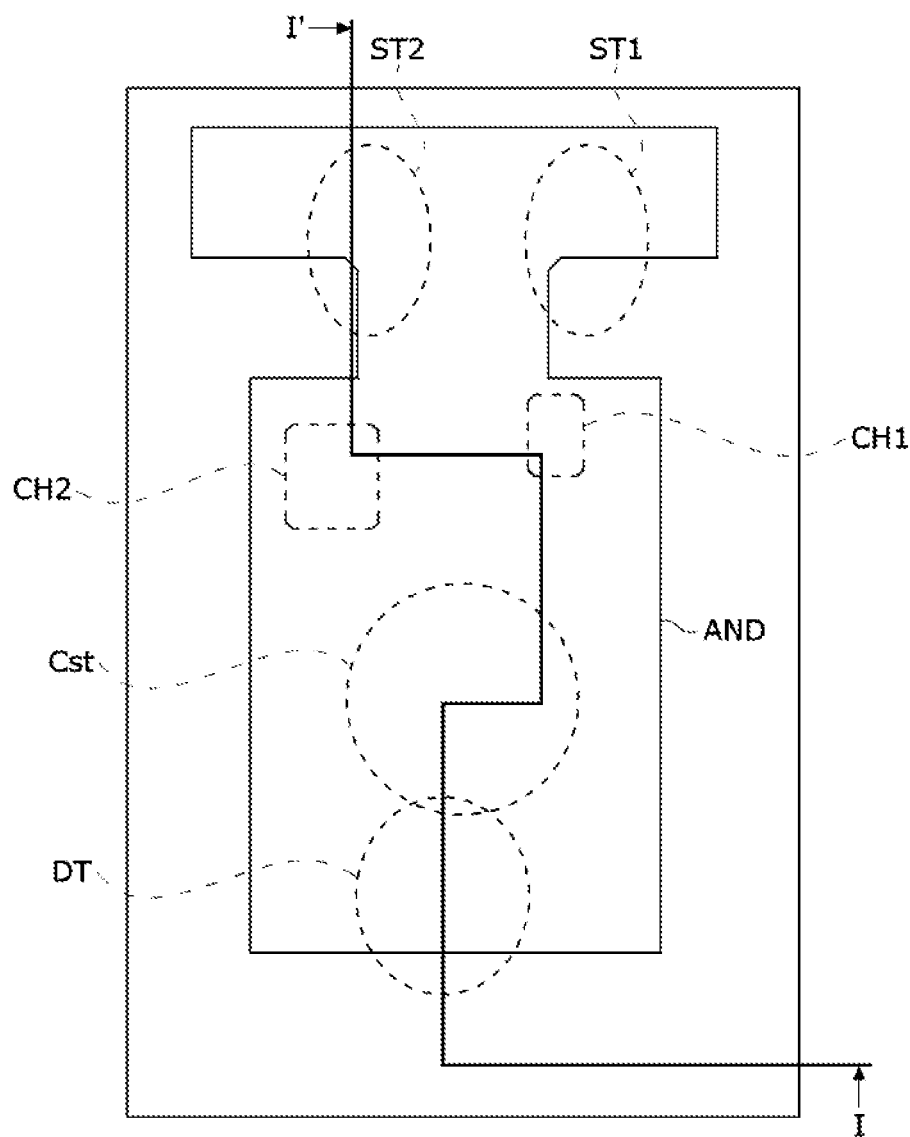
FIG. 9 is a plan view illustrating the anode electrode of a light emitting element shown in FIG. 4.

FIGS. 6 to 9 are plan views showing in detail the pattern shapes of main thin film layers separated from the cross-sectional structure of the pixel circuit shown in FIG. 4. FIG. 6 is a plan view illustrating patterns of the first metal layer ML1 shown in FIG. 3. FIG. 7 is a plan view illustrating patterns of the semiconductor layer ACT and the third metal layer MA shown in FIG. 5. FIG. 8 is a plan view illustrating patterns of the second metal layer ML2 shown in FIG. 3 FIG. 9 is a plan view illustrating the anode electrode AND of the light emitting element OLED shown in FIG. 4.

As shown in FIG. 6, the first metal layer ML1 includes a VDD line pattern M11, a bottom gate electrode pattern M12, a data line pattern M13, and the like. The bottom gate electrode pattern M12 includes the bottom gate electrode GE2 of the driving element DT and the bottom electrode CE1 of the storage capacitor Cst. The bottom gate electrode pattern M12 overlaps with the first contact hole CH1 and is exposed at the first contact hole CH1.

As shown in FIG. 7, the semiconductor layer ACT includes first and second semiconductor patterns A1 and A2.

The first semiconductor pattern A1 includes the semiconductor channel of the driving element DT, the source electrode of the driving element DT, the drain electrode of the driving element DT, the semiconductor channel of the second switch element ST2, the source electrode of the second switch element ST2, the drain electrode of the second switch element ST2, the intermediate electrode of the storage capacitor Cst, and the second VDD line PLH.

At the semiconductor channel portion of the driving element DT and the semiconductor channel portion of the second switch element ST2, the first semiconductor pattern A1 is not metalized. In the first semiconductor pattern A1, the source and drain electrodes of the driving element DT and the second switch element ST2 may be metalized, or may include the third metal layer formed on the semiconductor layer ACT. At the intermediate electrode CE2 of the storage capacitor Cst and the second VDD line PLH, the first semiconductor pattern A1 may be metalized or the third metal layer may be formed on the first semiconductor pattern A1.

The drain electrode of the second switch element ST2 is connected to a branch omitted in the drawing. The branch is connected to the REF line RL through a contact hole omitted in the drawing. At least a portion of the branch, for example, a portion passing through the light emitting region, may be formed of a semiconductor layer pattern metalized without the third metal layer in order to increase the aperture ratio and transmittance of the light emitting region. Hence, the drain electrode of the second switch element ST2 is connected to the REF line RL via the branch.

The first semiconductor pattern A1 overlaps with the second contact hole CH2 and is exposed at the second contact hole CH2. The anode electrode AND of the light emitting element OLED is connected to the first semiconductor pattern A1 through the second contact hole CH2 overlapping with the first semiconductor pattern A1. A part of the first semiconductor pattern A1 connected to the anode electrode AND at the second contact hole CH2 is a metalized portion of the semiconductor layer ACT or the third metal layer MA formed on the semiconductor layer.

The second semiconductor pattern A2 includes the semiconductor channel of the first switch element ST1, the source electrode of the first switch element ST1, and the drain electrode of the first switch element ST1. At the semiconductor channel portion of the first switch element ST1, the second semiconductor pattern A2 is not metalized. The drain electrode of the first switch element ST1 is connected to the data line DL through a contact hole omitted in the drawing. In the second semiconductor pattern A2, the source electrode and drain electrode of the first switch element ST1 are metalized, or include the third metal layer formed on the semiconductor layer ACT.

The second semiconductor pattern A2 overlaps with the first contact hole CH1 and is exposed at the first contact hole CH1. At the first contact hole CH1, the exposed second semiconductor pattern A2 may be metalized, or the third metal layer may be formed on the second semiconductor pattern A2.

As shown in FIG. 8, the second metal layer ML2 includes a top gate electrode pattern M21 and a gate line pattern M22. The top gate electrode pattern M21 includes the top gate electrode GE1 of the driving element DT and the top electrode CE3 of the storage capacitor Cst. The top gate electrode pattern M21 includes a 'C'-shaped or '⊏'-shaped pattern in order to connect the top gate electrode GE1 of the driving element DT and the top electrode CE3 of the storage capacitor Cst while avoiding the source electrode of the driving element DT.

The top gate electrode pattern M21 overlaps with the first contact hole CH1 and is in contact with the bottom gate electrode pattern M12 and the second semiconductor pattern A2 through the second contact hole CH2.

Figure 10:
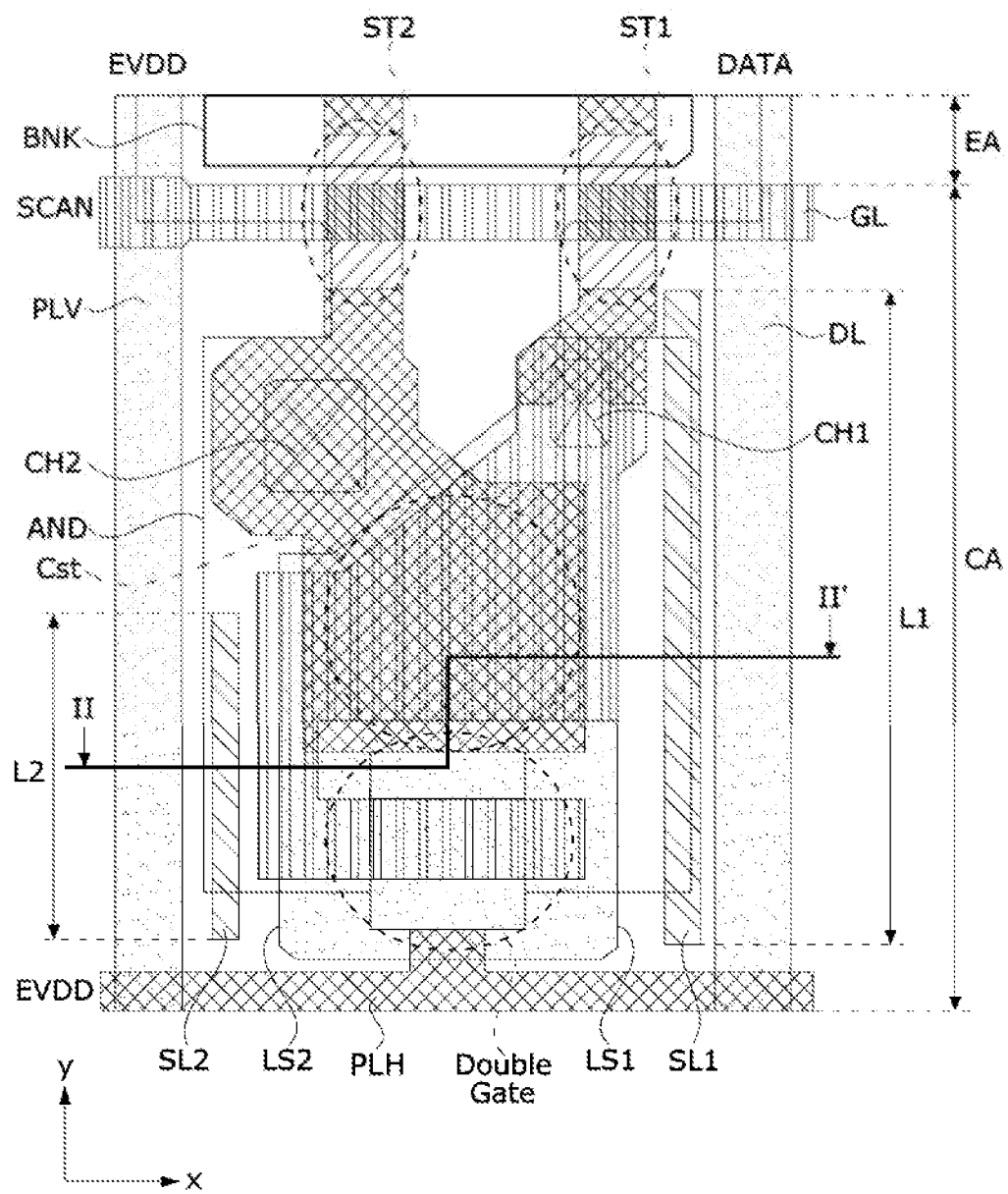
FIG. 10 is a plan view illustrating a pixel circuit of one subpixel in a display panel according to another aspect of the present disclosure.
Figure 11:
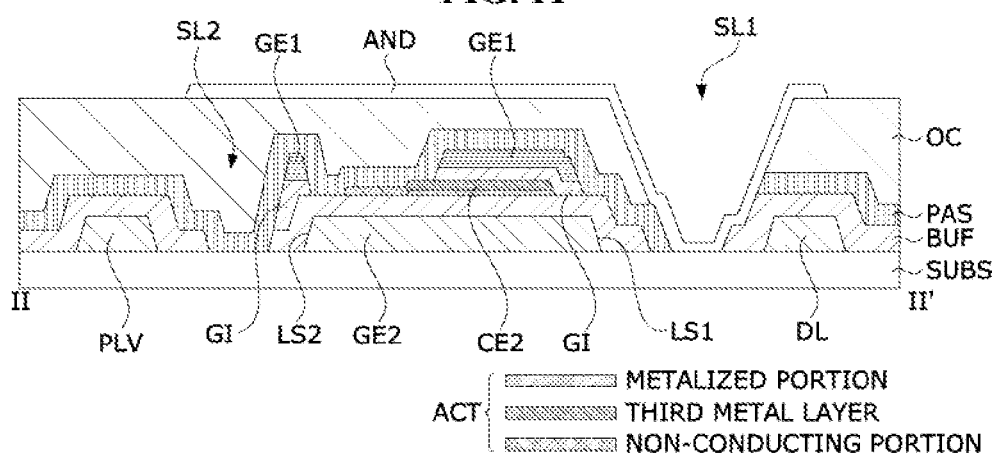
FIG. 11 is a cross-sectional view illustrating a cross-sectional structure of the pixel circuit taken along line II-II' in FIG. 10.
Figure 12:
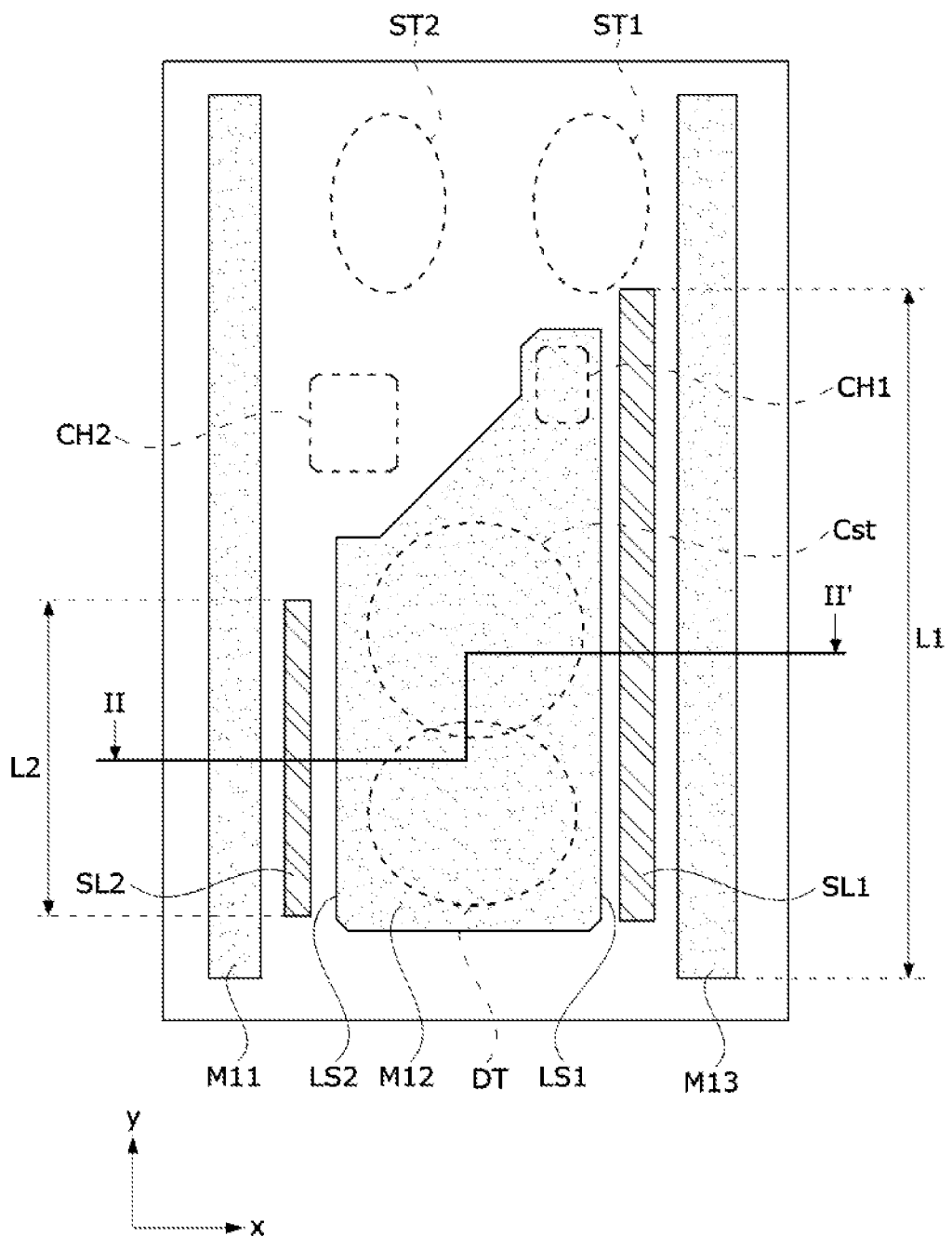
FIG. 12 is a plan view illustrating patterns of a first metal layer shown in FIG. 10.

FIG. 10 is a plan view illustrating a pixel circuit of one subpixel in a display panel according to another aspect of the present disclosure. FIG. 11 is a cross-sectional view illustrating a cross-sectional structure of the pixel circuit taken along line II-II' in FIG. 10. FIG. 12 is a plan view illustrating patterns of a first metal layer shown in FIG. 10. In FIGS. 10 to 12, components that are substantially the same as those of the above-described aspect are denoted by the same reference numerals, and detailed descriptions thereof will be omitted.

With reference to FIGS. 10 and 11, the pixel circuit may further include first and second slits SL1 and SL2.

The first slit SL1 is formed between the bottom gate electrode GE2 and the data line DL to block parasitic capacitance that causes crosstalk between them. The first slit SL1 is formed between one long side LS1 of the neighboring bottom gate electrode GE2 and the data line DL. As shown in FIGS. 10 and 12, the length L1 of the first slit SL1 may be set to be substantially the same as the length L1 of one long side LS1 of the bottom gate electrode pattern M12 including the bottom electrode CE1 of the storage capacitor Cst and the bottom gate electrode GE2.

In the first slit SL1, all insulating layers, such as the planarization layer OS, the passivation layer PAS, the gate insulating layer GI, and the buffer layer BUF, are removed in the etching process and are deeply dug. The anode electrode AND covers the sidewall (or side surface) and the bottom surface within the first slit SL1 to thereby minimize the parasitic capacitance between the bottom gate electrode GE2 and the data line DL.

The second slit SL2 is formed between the bottom gate electrode GE2 and the first VDD line PLV to prevent a short circuit therebetween and reduce parasitic capacitance. The second slit SL2 is formed between the other long side LS2 of the neighboring bottom gate electrode GE2 and the first VDD line PLV. As shown in FIGS. 10 and 12, the length L2 of the second slit SL2 may be set to be substantially the same as the length L2 of the other long side LS2 of the bottom gate electrode pattern M12.

The length L2 of the other long side LS2 of the bottom gate electrode pattern M12 may be set to be smaller than the length L1 of the one long side LS1. In the second slit SL2, insulating layers such as the gate insulating layer GI and the buffer layer BUF are removed in the etching process. The passivation layer PAS covers the side surface and the bottom surface of the second slit SL2, and the planarization layer OC is covered thereon to become flat.

The present disclosure, the means for achieving the features, and effects of the present disclosure described above do not specify essential features of the claims, and thus, the scope of the claims is not limited to the detailed description of the present disclosure.

Although the aspects of the present disclosure have been described in more detail with reference to the accompanying drawings, the present disclosure is not limited thereto and may be embodied in many different forms without departing from the technical concept of the present disclosure. Therefore, the aspects disclosed in the present disclosure are provided for illustrative purposes only and are not intended to limit the technical concept of the present disclosure. The scope of the technical concept of the present disclosure is not limited thereto. Therefore, it should be understood that the above-described aspects are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:
1. A display panel comprising:
a first metal layer;
a first insulating layer covering the first metal layer;
a semiconductor layer disposed on the first insulating layer;
an intermediate electrode disposed above the semiconductor layer, coupled to a driving element, and separated from the semiconductor
a second insulating layer disposed on the first insulating layer and covering the semiconductor layer and the intermediate electrode;
a second metal layer disposed on the second insulating layer,
wherein the first metal layer comprises a bottom gate electrode of the driving element a first electrode of the capacitor for the driving element overlapping the inter- mediate electrode, and a data line disposed on the same layer as the bottom gate electrode, wherein the second metal layer comprises a top gate electrode of the driving element connected to the bottom gate electrode through a first contact hole penetrating the second insulating layer and the first insulating layer and a second electrode of the capacitor for the driving element overlapping the intermediate electrode, wherein the first electrode of the capacitor and the second electrode of the capacitor are directly coupled through the first contact hole, and wherein the semiconductor layer comprises a semiconductor channel of the driving element overlapping with the top gate electrode and the bottom gate electrode.

2. The display panel of claim 1, further comprising a pixel circuit connected to the data line to which a data voltage is supplied, a gate line to which a gate signal is supplied, a VDD line to which a pixel driving voltage is supplied and an REF line to which a reference voltage is supplied.

3. The display panel of claim 2, wherein the pixel circuit comprises:
a first switch element configured to apply the data voltage to the top and bottom gate electrodes of the driving element in response to the gate signal;
a second switch element configured to apply the reference voltage to a source electrode of the driving element in response to the gate signal; and
a light emitting element driven by the driving element, wherein the pixel driving voltage is applied to a drain electrode of the driving element.

4. The display panel of claim 3, wherein the first metal layer comprises:
a first-first power line pattern to which the pixel driving voltage is applied;
a bottom gate electrode pattern including the bottom gate electrode of the driving element and a bottom electrode of the capacitor connected to the bottom gate electrode; and
a data line pattern including the data line.

5. The display panel of claim 3, wherein the second metal layer comprises:
a top gate electrode pattern that includes the top gate electrode of the driving element and the first electrode of the capacitor connected to the top gate electrode; and
a gate line pattern including the gate line.

6. The display panel of claim 4, wherein the semiconductor layer comprises:
a first semiconductor pattern that includes the semiconductor channel of the driving element, the intermediate electrode of the capacitor connected to the semiconductor channel of the driving element, the source electrode and drain electrode of the driving element, a semiconductor channel of the second switch element, a source electrode and drain electrode of the second switch element, and a first-second power line through which the pixel driving voltage is applied, and overlaps with a second contact hole, and
a second semiconductor pattern that includes a semiconductor channel of the first switch element, a source electrode and drain electrode of the first switch element, and overlaps with the first contact hole,
wherein the first-first power line pattern and the first-second power line cross each other with the first insulating layer interposed therebetween.

7. The display panel of claim 6, further comprising:
a third insulating layer disposed on the first insulating layer to cover the second metal layer and the semiconductor layer; and
a planarization layer disposed on the third insulating layer,
wherein an anode electrode of the light emitting element is connected to the first semiconductor pattern through the second contact hole,
wherein the second contact hole penetrates the planarization layer and the third insulating layer to expose the first semiconductor pattern, and
wherein a portion of the first semiconductor pattern connected to the anode electrode within the second contact hole is a metalized portion of the semiconductor layer or a metal layer formed on the semiconductor layer.

8. The display panel of claim 7, further comprising:
a first slit from which the planarization layer, the third insulating layer, the second insulating layer, and the first insulating layer are removed between one long side of the bottom gate electrode pattern and the data line pattern,
wherein the anode electrode of the light emitting element covers a side surface and bottom surface of the first slit, and
wherein the first slit reduces a parasitic capacitance between the bottom gate electrode and another conductor.

9. The display panel of claim 8, wherein a length of the first slit is substantially the same as a length of the one long side of the bottom gate electrode pattern.

10. The display panel of claim 9, further comprising a second slit from which the first insulating layer and the second insulating layer are removed between another long side of the bottom gate electrode pattern and the first-first power line pattern, and wherein the third insulating layer covers a side surface and bottom surface of the second slit,
wherein the second slit reduces a parasitic capacitance between the bottom gate electrode and another conductor.

11. The display panel of claim 10, wherein a length of the second slit is substantially the same as a length of the another long side of the bottom gate electrode pattern.

12. The display panel of claim 1, wherein the intermediate electrode is formed of a third metal layer or a metalized portion of the semiconductor layer disposed on a same layer as the semiconductor channel and extended from the semiconductor channel.

13. A display panel comprising:
a driving element configured to supply a current to a light emitting element;
a first switch element configured to connect a data line through which a data voltage is applied to a gate electrode of the driving element in response to a gate signal from a gate line;
a second switch element configured to apply a reference voltage to a source electrode of the driving element in response to the gate signal; and
a capacitor connected between the gate electrode of the driving element and the source electrode of the driving element,
wherein the gate electrode of the driving element comprises a top gate electrode and a bottom gate electrode, and a semiconductor layer including a semiconductor channel interposed therebetween, the top gate electrode overlapping with the bottom gate electrode, wherein the top gate electrode is in contact with the bottom gate electrode through a first contact hole penetrating a first insulating layer between the bottom gate electrode and the semiconductor layer and a second insulating layer between the top gate electrode and the semiconductor layer, wherein an anode electrode of the light emitting element is in contact with the semiconductor layer through a second contact hole penetrating a third insulating layer covering the driving element and the first and second switch elements and a planarization layer disposed on the third insulating layer, wherein the bottom gate electrode and the data line are disposed on a same layer, wherein the capacitor has a top electrode disposed on a same layer as the top gate electrode, a bottom electrode disposed on a same layer as the bottom gate electrode, and an intermediate electrode disposed between the top electrode and the bottom electrode and connected to the source electrode of the driving element, and wherein the top electrode of the capacitor and the bottom electrode of the capacitor are directly coupled through the first contact hole and each form a capacitance with the intermediate electrode.

14. The display panel of claim 13, further comprising a first slit from which the planarization layer, the third insulating layer, the second insulating layer, and the first insulating layer are removed between the bottom gate electrode and the data line,
wherein the anode electrode of the light emitting element covers a side surface and bottom surface of the first slit.

15. The display panel of claim 13, further comprising:
a power line through which a pixel driving voltage is applied; and
a second slit from which the first insulating layer and the second insulating layer are removed between the bottom gate electrode and the power line,
wherein the third insulating layer covers a side surface and bottom surface of the second slit.

16. A display device comprising:
a display panel in which a plurality of data lines, a plurality of gate lines crossing the data lines, a plurality of first power lines through which a pixel driving voltage is applied, a plurality of second power lines through which a reference voltage is applied, and a plurality of pixels are arranged;
a data driver configured to supply a data voltage of pixel data through the data lines; and
a gate driver configured to supply a gate signal through the gate lines, wherein each of the pixels comprises:
a driving element configured to supply a current to a light emitting element;
a first switch element configured to connect the data line through which the data voltage is applied to a gate electrode of the driving element in response to the gate signal from the gate line;

a second switch element configured to apply the reference voltage lower than the pixel driving voltage to a source electrode of the driving element in response to the gate signal; and
a capacitor connected between the gate electrode of the driving element and the source electrode of the driving element, wherein the gate electrode of the driving element comprises a top gate electrode and a bottom gate electrode, and a semiconductor layer including a semiconductor channel interposed therebetween, the top gate electrode overlapping with the bottom gate electrode, wherein the top gate electrode is in contact with the bottom gate electrode through a first contact hole penetrating a first insulating layer between the bottom gate electrode and the semiconductor layer and a second insulating layer between the top gate electrode and the semiconductor layer, wherein an anode electrode of the light emitting element is in contact with the semiconductor layer through a second contact hole penetrating a third insulating layer covering the driving element and the first and second switch elements and a planarization layer disposed on the third insulating layer, wherein the bottom gate electrode and the data line are disposed on a same layer, wherein the capacitor has a top electrode disposed on a same layer as the top gate electrode, a bottom electrode disposed on a same layer as the bottom gate electrode, and an intermediate electrode disposed between the top electrode and the bottom electrode, connected to the source electrode of the driving element, and wherein the top electrode of the capacitor and the bottom electrode of the capacitor are directly coupled through the first contact hole and each form a capacitance with the intermediate electrode.

17. The display device of claim 16, further comprising a first slit from which the planarization layer, the third insulating layer, the second insulating layer, and the first insulating layer are removed between the bottom gate electrode and the data line.

18. The display device of claim 17, wherein the anode electrode of the light emitting element covers a side surface and bottom surface of the first slit.

19. The display device of claim 16, further comprising a second slit from which the first insulating layer and the second insulating layer are removed between the bottom gate electrode and a first power line.

20. The display device of claim 19, wherein the third insulating layer covers a side surface and bottom surface of the second slit.

* * * * *